United States Patent
Ouzounov et al.

(10) Patent No.: US 10,284,223 B2
(45) Date of Patent: May 7, 2019

(54) METHOD OF PERFORMING ANALOG-TO-DIGITAL CONVERSION

(71) Applicant: KONINKLIJKE PHILIPS N.V., Eindhoven (NL)

(72) Inventors: Sotir Filipov Ouzounov, Eindhoven (NL); Ketan Pol, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/757,001

(22) PCT Filed: Sep. 6, 2016

(86) PCT No.: PCT/EP2016/070912
§ 371 (c)(1),
(2) Date: Mar. 2, 2018

(87) PCT Pub. No.: WO2017/045962
PCT Pub. Date: Mar. 23, 2017

(65) Prior Publication Data
US 2018/0269896 A1    Sep. 20, 2018

(30) Foreign Application Priority Data
Sep. 15, 2015   (EP) .................................... 15185239

(51) Int. Cl.
*H03M 3/00* (2006.01)
(52) U.S. Cl.
CPC .............. *H03M 3/49* (2013.01); *H03M 3/32* (2013.01); *H03M 3/322* (2013.01); *H03M 3/422* (2013.01);
(Continued)

(58) Field of Classification Search
CPC .................................. H03M 3/49; H03M 3/32
(Continued)

(56) References Cited

U.S. PATENT DOCUMENTS

| 5,187,482 A | 2/1993 | Tiemann |
| 7,295,645 B1 | 11/2007 | Ei-Ghoroury |

(Continued)

OTHER PUBLICATIONS

Reyhani, et al., "A SAR-based [Sigma] [Delta] modulator using shared DAC"; Analog Integr Cir Sig Process (2014).
(Continued)

*Primary Examiner* — Peguy Jean Pierre

(57) ABSTRACT

The invention describes a method of performing analog-to-digital conversion on an input signal ($P_{in}$) within a range (R1) using a sigma-delta modulator (1) comprising a feedback digital-to-analog conversion arrangement (12, 120), which method comprises the steps of: obtaining an amplitude estimate (E1, E2, E3, E4) of the input signal ($P_{in}$); defining a subsequent subrange (R2, R3, R4) on the basis of the amplitude estimate (E1, E2, E3); and adjusting operation parameters of the feedback digital-to-analog conversion arrangement (12, 120) on the basis of the subsequent subrange (R2, R3, R4); whereby the method steps are repeated a predefined number of iterations (N). The invention further describes a sigma-delta modulator (1), an analog-to-digital converter (50), and a monitoring device (5) for monitoring an analog input signal ($P_{in}$).

13 Claims, 7 Drawing Sheets

(52) U.S. Cl.
CPC ........... H03M 3/464 (2013.01); H03M 3/496 (2013.01); H03M 3/43 (2013.01); H03M 3/438 (2013.01)

(58) Field of Classification Search
USPC .......................... 341/118, 120, 143, 144, 155
See application file for complete search history.

(56) References Cited

U.S. PATENT DOCUMENTS

| | | | |
|---|---|---|---|
| 7,446,686 | B2 | 11/2008 | Rueger |
| 7,656,330 | B2* | 2/2010 | O'Dowd ............... H03M 1/181 341/143 |
| 7,825,837 | B1 | 11/2010 | Khasnis |
| 8,723,706 | B1 | 5/2014 | Shin |
| 2006/0097899 | A1* | 5/2006 | Nagai ..................... H03M 3/48 341/143 |
| 2015/0031971 | A1 | 1/2015 | Lisogurski |
| 2016/0134302 | A1* | 5/2016 | Schafferer ............ H03F 1/3241 341/120 |

OTHER PUBLICATIONS

Fredenburg et al: "A 90-MS/s 11-MHz-Bandwidth 62-dB SNDR Noise-Shaping SAR ADC"; IEEE Journal of Solid-State Circuits, Service Center, Piscataway, NJ, USA, vol. 47, No. 12, Dec. 1, 2012.

Samid L et al: "A multibit continuous time sigma delta modulator with successive-approximation quantizer", 2006 IEEE International Symposium on Circuits and Systems May 21-24, 2006 Island of Kos, Greece, IEEE—Piscataway, NJ, USA, May 21, 2006.

J. Markus, J. Silva, and G. Temes, "Theory and applications of incremental delta; sigma; converters," Circuits and Systems I: Regular Papers, IEEE Transactions on, vol. 51, No. 4, pp. 678-690, Apr. 2004.

C.-H. Chen, Y. Jung, J. Ceballos, and G. Temes, "Multi-step extended counting analogue-to-digital converters," Electronics Letters, vol. 49, No. 1, pp. 30-31, Jan. 2013.

C.-H. Chen, Y. Zhang, Y. Jung, T. He, J. Ceballos, and G. Temes, "Two-step incremental analogue-to-digital converter," Electronics Letters, vol. 49, No. 4, pp. 250-251, Feb. 2013.

Y. Chae, K. Souri, and K. Makinwa, "A 6.3 uw 20 bit incremental zoom adc with 6 ppm inl and 1 uv offset," Solid-State Circuits, IEEE Journal of, vol. 48, No. 12, pp. 3019-3027, Dec. 2013.

Caldwell, et al., "Incremental Data Converters at Low Oversampling Ratios"; IEEE Transactions on Circuits and Systems—I: Regular Papers, vol. 57, No. 7, Jul. 2010.

Broaders, "Wearable Electronic Devices Monitor Vital Signs, Activity Level, and More"; Analog Dialogue 48-12, Dec. 2014.

Chevroulet, "Using ZoomingADC to Adapt the ADC to the Sensor, and not the Other Way Around!", White Paper 2014.

* cited by examiner

METHOD OF PERFORMING ANALOG-TO-DIGITAL CONVERSION

CROSS REFERENCE TO RELATED APPLICATIONS

This application is the U.S. National Phase application under 35 U.S.C. § 371 of International Application No. PCT/EP2016/070912, filed Sep. 6, 2016, published as WO 2017/045962 on Mar. 23, 2017, which claims the benefit of European Patent Application Number 15185239.9 filed Sep. 15, 2015. These applications are hereby incorporated by reference herein.

FIELD OF THE INVENTION

The invention describes a method of performing analog-to-digital conversion. The invention further describes a sigma-delta modulator, an analog-to-digital converter and a device for performing analog-to-digital conversion.

BACKGROUND OF THE INVENTION

The dynamic range of an analog-to-digital converter (ADC) is the ratio of the maximum signal applied at the input to the smallest detectable value. The resolution of an ADC refers to its smallest resolvable input step or smallest detectable value, which is determined by the quantization noise. A high resolution over a large dynamic range is expensive, since it requires an ADC with a large effective number of bits (ENOB). For example, when performing analog-to-digital conversion on an input voltage signal, a 9-bit ADC may be sufficient to resolve a voltage of 15.0 µV within a 10-millivolt range. However, to obtain the same resolution within a 1-volt range would require a 16-bit ADC. Each additional bit of an ADC adds to the overall cost and power consumption, and lowers the conversion speed.

Some kinds of ADC use a delta-sigma (Δs) or sigma delta (ΣΔ) modulator (SDM) to sample the analog input and to convert the samples into a digital bitstream output, which can then be processed, for example by a decimation filter, to obtain a digital output value. A sigma-delta ADC incorporates a feedback loop with a digital-to-analog converter (DAC) that performs digital-to-analog conversion on the output bitstream and subtracts the analog feedback signal from the analog input signal. The SDM effectively operates to minimize the difference between input and output. In its forward path, an SDM uses an active loop filter that provides the required input sensitivity and signal-to-noise ratio, and which shapes the quantization noise of a simple comparator (often just a 1-bit comparator) out of the required signal band. SDMs are very well suited for instrumentation and low frequency sensing or DC (direct current) sensing on account of their favorably high resolution and accuracy and relatively low cost. Applications that use SDMs can be analog and mixed-signal front-ends of the type required in medical sensing and imaging, e.g. in amperometry and lab-on-a-chip implementations, for which the analog signals of interest are predominantly DC or very slowly varying. A lab-on-a-chip (LOC) or a micro total analysis system (µTAS) is a device that comprises an integrated circuit in which one or more laboratory functions are realized. Generally, a sensor provides an analog signal input to the device, which must first perform analog-to-digital conversion in order to be able to process the information. Accurate conversion is necessary in order to perform accurate analysis.

An SDM encodes the input signal amplitude into the output bitstream after observing the input over a finite number of clock samples. The number of samples, often referred as the observation interval, determines the time duration of each analog-to-digital conversion step, and translates to the required time and power consumption of each conversion instance. A relevant design aspect is the oversampling ratio (OSR), i.e. the ratio of the input signal frequency to the sampling frequency. A high OSR is associated with a higher and therefore more favorable signal-to-quantization-noise ratio. However, for an SDM ADC with a fixed filter order, clock speed and quantizer resolution, the quantization noise directly determines the smallest input signal that can be resolved, i.e. a large input signal range is associated with a relatively high level of quantization noise in the feedback loop. Therefore, to maintain a certain resolution, increasing the input signal range requires increasing the resolution of the ADC. If the resolution of the ADC is fixed, for example by its specific effective number of bits (ENOB), a larger input signal range will result in lower conversion accuracy.

The accuracy of encoding in the known types of SDM ADCs—for which the accuracy is largely determined by quantization noise—can be improved by extending the observation interval, i.e. to increase the number of clock cycles. Alternatively, a higher order analog filter can be implemented in the SDM, allowing the observation interval to be shortened. Raising the filter order reduces the number of samples that need to be taken in order to achieve the desired accuracy, but higher order filters have lower maximum stable amplitude and also consume more power on account of the increased number of operational amplifiers. Other attempts at improvement are known, for example using a two-step approach with a first rough conversion step using a successive-approximation stage, and a second fine conversion step using an incremental SDM stage. However, such an ADC is expensive to build and also has unfavorably high energy consumption.

Therefore, it is an object of the invention to provide an improved incremental sigma-delta modulator that overcomes the problems outlined above.

SUMMARY OF THE INVENTION

According to the invention, the method of performing analog-to-digital conversion on an input signal within an input signal range—using a sigma-delta modulator—comprises the steps of obtaining a digital amplitude estimate of the analog input signal and then adjusting the dynamic range of the SDM by defining a narrower subrange on the basis of the amplitude estimate and adjusting operation parameters of the SDM feedback digital-to-analog converter on the basis of the defined subrange. The method steps are repeated for a predefined number of iterations. The last or final amplitude estimate can subsequently be converted to a very accurate digital output. Preferably, at least three iterations are performed so that an initial coarse estimate is obtained, followed by at least one further refined (but still relatively coarse) estimate before obtaining the final accurate estimate. The total number of coarse estimates obtained can depend on the application. Generally, a higher number of coarse estimates may be appropriate when higher conversion accuracy is desired.

Here, the input signal is the momentary analog signal which is to be converted to a digital bitstream. Preferably, the analog input signal originates from a sensing device that outputs a current (ampere) or charge (coulomb) as a measure of an observed quantity. The "input signal range" may be understood to be the range of non-overload amplitudes at the input between an initial lower bound and an initial upper bound. Depending on certain factors such as sampling clock rate, filter order etc., the SDM can convert an analog input signal to a digital bitstream within a few milliseconds or even microseconds. The inventive method establishes an initial rough estimate of the analog input and iteratively refines the estimate by progressively adjusting or configuring the operation parameters of the feedback DAC to "zoom into" the neighborhood of the estimate. This is achieved in the method according to the invention by adapting the dynamic range of the SDM. In each iteration, the SDM is effectively reset before being configured on the basis of the latest estimate. In the method according to the invention, the upper and lower bounds of a subrange are essentially independent of the bounds of the previous range, i.e. the midpoint of a subrange need not coincide with the midpoint of the previous range. The step of adjusting operation parameters of the feedback DAC on the basis of the identified subrange in each iteration is referred to in the following as adaptive dynamic range scaling or "dynamic range adjustment". During the iteration steps in the inventive method, the "input signal range" may therefore be understood to be the range of non-overload amplitudes at the momentary or current dynamic range.

An advantage of the method according to the invention is that a favorably high conversion accuracy is realized without having to expend extra energy on a higher-order input filter or on a higher clock rate, i.e. greater accuracy is achieved without increasing conversion time or energy requirement. The method according to the invention is particularly suited for the conversion of an analog signal that is predominantly DC or varies only slowly, and can equally well be used to measure AC signals. Another advantage of the method according to the invention is that a favorably low quantization noise floor can be achieved by adjusting the dynamic range to the vicinity of the input value.

According to the invention, the sigma-delta modulator comprises a forward path comprising an active loop filter and a quantizer for obtaining an amplitude estimate of an input signal within an input range; and a feedback arrangement comprising a digital-to-analog converter and a range adjustment means, which range adjustment means is realized to adjust the dynamic range of the sigma-delta modulator on the basis of the amplitude estimate.

In the inventive sigma-delta modulator, the feedback digital-to-analog converter is essentially a programmable DAC which can be set to perform digital-to-analog conversion over a specific range, and this range is newly defined at each iteration in such a way as to "zoom in" on the estimated analog input, so that the estimate is refined with each iteration. The input to the feedback DAC is the previously obtained estimate, and the output of the feedback DAC is subtracted from the analog input signal. The aim of the SDM is to minimize this difference. An advantage of the inventive SDM is that it can achieve a favorably high effective resolution over a relatively large input range and can do this with a favorably economical low-order filter and relatively low sampling clock rate, i.e. a high-resolution or accurate final estimate is obtained in a favorably short time.

According to the invention, the analog-to-digital converter for performing analog-to-digital conversion on an input signal comprises such a sigma-delta modulator.

Therefore, the inventive ADC can be realized in a very power-efficient manner, and can achieve a higher effective resolution and/or a faster conversion rate than a prior art ADC that implements a comparable prior art sigma-delta modulator. The "conversion range" of the inventive ADC—i.e. the possible range of input signal amplitude—can be favorably large due to the adaptive dynamic range scaling implemented by its SDM.

According to the invention, the device for performing analog-to-digital conversion on an analog input signal utilizes an ADC that implements a sigma-delta modulator according to the invention. The device can be realized for use in a monitoring application, an imaging application, or any other kind of application in which an analog input signal is to be monitored and/or imaged.

An advantage of the monitoring device according to the invention is that it is provided with a very accurate digital output, which can then be used as desired, for example the monitoring device may be an electrocardiograph (ECG), an electroencephalograph (EEG), or a medical imaging device such as an ultrasound transducer, etc. In another possible implementation, the monitoring device can be used in an amperometry application, a lab-on-a-chip application, etc. The monitoring device according to the invention is particularly suited for use in applications where the analog signal of interest is predominantly DC or varies only slowly. Furthermore, since the inventive sigma-delta modulator can be realized to provide high accuracy at low power consumption, the monitoring device according to the invention is particularly suited for realization as a battery-powered wearable device that must have low power consumption, for example a battery-powered portable EEG.

The following description discloses particularly advantageous embodiments and features of the invention. Features of the embodiments may be combined as appropriate. Features described in the context of one claim category can apply equally to another claim category.

As mentioned above, the input signal preferably originates from a sensing device that delivers a current output, for example a medical sensing device, a transducer, an amperometry device or similar. A medical sensor may be used in tracking the electrical activity in the brain, heart and muscles of a living body. Transducers are used for various purposes, for example to convert acoustic pressure into an electrical current. An amperometry device may be used in a wide variety of applications, for example to track the electrical charge variation due to protein capture in silicon nanopores. In the following, but without restricting the invention in any way, it may be assumed that the input signal is a current. The terms "input current" and "input signal" may be used interchangeably. It may also be assumed that the SDM is used in an ADC designed to cover the range of the input signal that is being measured or monitored. The terms "delta-sigma modulator" and "sigma delta modulator" may be used interchangeably in the following.

In the context of the invention, therefore, the initial range is essentially the range of the ADC for the application in which it is to be used, for example a range between −10.0 mA and +10.0 mA, etc. In each iteration of the analog-to-digital conversion, a subrange or narrower range is identified within the previous range. In other words, the subrange identified during an iteration is narrower than the range of the preceding iteration, whereby a midpoint of the new subrange is independent of the midpoint of the previous range. In other words, the feedback DAC is "asymmetric" and can be configured or controlled to make feedback steps of different magnitudes and direction. Preferably, the feedback DAC is a single-bit DAC that generates asymmetric feedback depending on the value of the output bitstream. In other words, the DAC can be controlled in any one iteration such that the new subrange is shifted downwards or upwards within the previous range, and such that the size of the new subrange is independent of the size of the previous subrange. An advantage of this kind of implementation is that it enables the SDM to zoom in towards the input estimate while remaining within the resolution error, which is determined by the filter order, clock speed and quantizer bits. In a preferred embodiment of the invention, the method steps are iterated at least twice, more preferably at least three times, and the analog-to-digital conversion terminates with the output bitstream of the final estimate. This can be forwarded to the next stage in a digital signal processing application, for example to a decimation filter.

As mentioned above, the OSR of a conventional SDM determines the accuracy of the digital-to-analog conversion. For an incremental SDM, the term OSR is understood as the number of clock samples between each reset. This is often referred to as the "observation interval" or the "integration period". For a purely DC input, the number of samples is used instead to convey the same meaning. The method according to the invention is based on the insight that even only a rough estimate of the input value is enough to determine its position in the present range and to identify the interval to be used as the next range, at least for the first few iterations. Therefore, in a particularly preferred embodiment of the invention, an estimate of the input signal is obtained at a low accuracy level in a non-final iteration of the method steps. This is preferably achieved by applying an oversampling ratio that is as low as possible, whereby the applicable oversampling ratio is determined to some extent by the SDM filter order. In the method according to the invention, faster conversion is achieved by using a low OSR to initially obtain only a coarse estimate when zooming into the neighborhood of the input signal. This achieves a significant reduction in conversion time for an early estimate, thereby significantly reducing the overall ADC conversion time. Therefore, in a preferred embodiment of the invention, a non-final estimate is obtained at an oversampling ratio that is low with respect to a filter order of the modulator's feedforward analog filter. For example, for a second-order or third-order filter, an oversampling ratio of at most 30, more preferably at most 20, more preferably at most 5, may be applied in the non-final iterations of the method steps. In this way, the non-final iterations can be performed by taking less samples and thereby reducing the conversion time, so that this part of the conversion consumes only a favorably low amount of power.

The unknown input signal is preferably estimated to the highest possible accuracy (resolution). Therefore, in a further preferred embodiment of the invention, the final iteration of the method steps is performed at a high accuracy level. This can be achieved in a number of ways. In one approach, the desired higher accuracy of the final conversion can be realized by switching from one-bit to multi-bit operation, i.e. by using a one-bit converter for the non-final iterations and using a multi-bit converter for the last stage, or vice versa. In another approach, a low-order filter may be used for the non-final iterations, and a higher-order filter may be used for the final conversion step. However, these approaches require additional circuitry for the final conversion step. Therefore, in a particularly preferred embodiment of the invention, the higher accuracy is achieved by using a higher oversampling ratio or by taking into account more output samples. Using the example of the $2^{nd}$ order filter mentioned above, an oversampling ratio of at least 50, more preferably at least 100, most preferably at least 200 can be applied in the final conversion step. In this way, complete utilization of the available resources in terms of power and conversion time is only required during the conversion of the estimate obtained in the final iteration of the method steps. The inventive multi-step approach has been observed to achieve a high effective resolution over a relatively large input signal range while requiring only a low order filter and a low oversampling ratio in the non-final iterations.

In a conventional SDM, the dynamic range is fixed, i.e. it does not change. In the method according to the invention, the dynamic range increases in each iteration since the method effectively "decreases" the smallest detectable value at each step. Preferably, the step of configuring the feedback DAC—i.e. the step of adjusting its operation parameters—comprises adjusting its gain and/or its offset. This can be achieved by realizing the feedback DAC to have adjustable gain and/or offset. Preferably, the range adjustment means comprises suitable logic to process the output bitstream and to identify an appropriate subrange, and subsequently to adjust the gain and/or offset of the asymmetrically controllable feedback DAC. For example, identification of the new subrange from the output bitstream can be implemented using relatively simple digital logic to average the output to a rough estimate.

On the circuit level, the identification of a subrange can be implemented in various ways. For example, the feedback DAC of the inventive SDM can comprise a suitably scaled configurable switched-capacitor bank, allowing a favorably compact implementation. A very accurate matching of the integrated capacitors is possible, so that the gain of the DAC can be set very precisely in each iteration. In such an embodiment, the subrange can be set during an iteration by suitably controlling the DAC reference voltages and/or appropriate switching of the capacitor bank values. Alternatively, a variable charge redistribution architecture could be used.

In a symmetric SDM as used in the conventional solutions, a feedback DAC (implemented as a capacitor bank) produces charges of equal magnitude but of opposite polarity. This is because the polarity of the voltage applied to the DAC is determined by the output of the comparator (logic 1 or 0), and the capacitor values of the feedback DAC are static. A logic "1" at the input to the DAC of a conventional SDM switches a capacitor with a first polarity, while a logic "0" at the input to the DAC switches a capacitor of the same size but with opposite polarity. This results in a DAC output with fixed magnitude and a polarity determined by the comparator, and the mid-point of the dynamic range of such a conventional SDM is always at a pre-determined bias voltage (e.g. 0 V). In the inventive asymmetric operation mode, the feedback DAC delivers charges of the same polarity but of different magnitudes. To achieve this, the voltage applied to the DAC is kept static, while the capacitance of the DAC is made dynamic—i.e. the capacitors of a switched capacitor bank are dynamically controlled depending on the comparator decision. For a 1-bit SDM with DC input, a logic "1" at the input to the DAC switches a capacitor with one value, while a logic "0" at the input to the DAC switches a capacitor with a different value (but the same polarity). For example, a switched capacitor bank can comprise a bank of capacitor pairs. One of each pair can be selected according to whether the comparator output is "1" or "0", so that the charge transferred to the DAC output stays at the same polarity but alters in magnitude depending on the decision of the comparator. The DAC applies a gain and an offset in the feedback path by producing asymmetric charges using the technique described above. The gain acts to expand the dynamic range (by "shrinking" the actual range to zoom into a region of interest) with successive steps of a conversion, while the offset serves to shift the dynamic range in a specific direction.

The N-step "zooming" technique applied by the SDM according to the invention—using a lower OSR for the initial estimations and a higher OSR for the final estimation—can achieve a higher ADC resolution than a comparable prior art SDM with the same area and the same power consumption. In particular, the use of a lower OSR can significantly reduce the ADC conversion time, i.e. the time required to perform an analog-to-digital conversion. The DAC runs on a high-frequency sampling clock, and can be reprogrammed within one clock cycle, so that the step of identifying a new subrange is favorably fast.

Preferably, the step of defining or identifying a subrange comprises dividing the preceding range into a number M of subranges, and identifying or selecting the subrange that includes the latest, i.e. most recent amplitude estimate. The number of subranges can be referred to as the scaling factor, so that a dynamic range scaling scheme with a scaling factor M effectively zooms into a neighborhood or subrange that corresponds to 1 M-th of the previous range. On the basis of the previously obtained estimate, the SDM is configured or set to convert only signals that fall within the present subrange, so that the input range is dynamically updated or adjusted with each iteration.

In the method according to the invention, the SDM configuration can be dynamically adjusted between the initial coarse estimation step and the subsequent finer estimation steps. For example, it is possible to change configuration parameters such as the order of the feedback DAC and/or the number of bits and/or the sampling rate. These adjustments can be made after each iteration (during a conversion) and/or after reset (upon completion of a conversion). Adjustments relating to the SDM performance can be made simultaneously with any adjustments relating to the DAC.

As mentioned above, the resolution of an ADC defines its smallest resolvable input step. Maintaining a high resolution over a relatively large signal range is costly, since it requires an ADC with a large effective number of bits (ENOB). The accuracy or effective resolution can be improved by the inventive method, by choosing a suitably high number of iterations N and a suitable scaling factor M. The effective resolution of an M-ary, N-step method according to the invention can be expressed as:

$$Resolution_{eff} = \log_2 \frac{DR}{M^{N-1}2^{ENOB}} \quad (1)$$

where DR is the initial signal range or the "conversion range" for the SDM, M is the scaling factor and N is the number of iterations. The effective resolution is determined by the combination of filter order, quantizer resolution and clock speed. For any given combination, there is a maximum achievable resolution, represented by the effective number of bits ENOB. For example, a $2^{nd}$ order 1-bit SDM requires an observation interval of approximately 100 samples to achieve a 10-bit ENOB. In this case, the ENOB is 10 and an OSR of 100 is assumed when applying equation (1). The effective number of bits is the accuracy which could be achieved in a single step using the full or highest possible oversampling ratio. In a preferred embodiment of the invention, the preceding range is divided into at least two subranges, i.e. the scaling factor M is at least 2. More preferably, the scaling factor is at least three. The previous range is divided into M subranges, from which one subrange—the one containing the input estimate—is identified to become the SDM range for the next conversion and subsequent iteration. In other words, the SDM dynamic range has been "adjusted". The number of output bits required for conversion is dependent on the scaling factor. For a binary division (M=2), the sign of the coarse estimate is sufficient, since it is only necessary to identify whether the input signal is below or above the midpoint of the input range. For a quaternary division (M=4), the coarse estimate must be accurate within two bits to ensure identification of the correct subrange. As a result, the number of samples required in each iteration increases in proportion to the scaling factor M.

The SDM according to the invention successively zooms into the neighborhood of the applied input signal. By applying its intrinsic conversion accuracy over a narrower amplitude range, the SDM achieves a higher effective resolution, and therefore achieves a higher ENOB. In a preferred embodiment of the invention, the SDM is configured to achieve an effective resolution or ENOB of at least 10 bits, more preferably at least 15 bits, more preferably at least 20 bits. The total number of steps that can practicably be achieved for the inventive SDM depends to some extent on the chosen DAC architecture and also on other circuit considerations such as noise. The final conversion step may utilize a more accurate decimation filter to provide the accurate output to a following unit such as a digital signal processor.

In sigma-delta modulation, the quantization error increases when the input signal lies close to an upper boundary of the input range, because a higher-order modulator will overload (become less linear) as the input signal value approaches the boundary. For example, a second-order SDM starts overloading when the input lies within the upper 20% of the present range. Conversion accuracy can be significantly reduced when an SDM overloads. For this reason, some prior art approaches use only a first-order SDM that does not suffer from overloading. However, the drawback of using only a first-order SDM is that it can achieve very limited resolution, requires higher acquisition time and suffers from non-linearity and spurious behavior. In the asymmetric approach taken by the method according to the invention, a range boundary can coincide with the largest positive and negative signal that the SDM can handle in the present dynamic range without overloading. To this end, in a further preferred embodiment of the invention, the identified subrange comprises at least half of the preceding range, so that M subranges of the present range overlap at their boundaries to effectively extend beyond the overload region. In this case, the effective resolution can be expressed as:

$$Resolution_{eff} = \log_2 \left[ \frac{DR_1}{\prod_{i=1}^{N_{step}-1} \left[ \frac{DR_i}{\frac{DR_i}{M}} + 2 \cdot OV \cdot DR_i \right] 2^{ENOB}} \right] N_{step} > 1 \quad (2)$$

$$DR_{i+1} = \frac{DR_i}{M} + 2 \cdot OV \cdot DR_i$$

Here, OV is the percentage overlap, and $DR_i$ is the range for the i-th iteration. Range overlapping reduces the error when the input signal value is close to a range boundary, and slightly reduces the effective resolution. Preferably, the range adjustment means can be realized to identify whether the previous estimate is too close to a boundary, and to implement such overlapping subranges accordingly.

In a further preferred embodiment of the invention, the monitoring device comprises an interface realized to accept a user input to convert the user input into an appropriate control signal to the SDM. For example, a user input could be used to adjust the conversion accuracy to a desired level, for example to set the oversampling ratio to be used on the final conversion step, etc.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
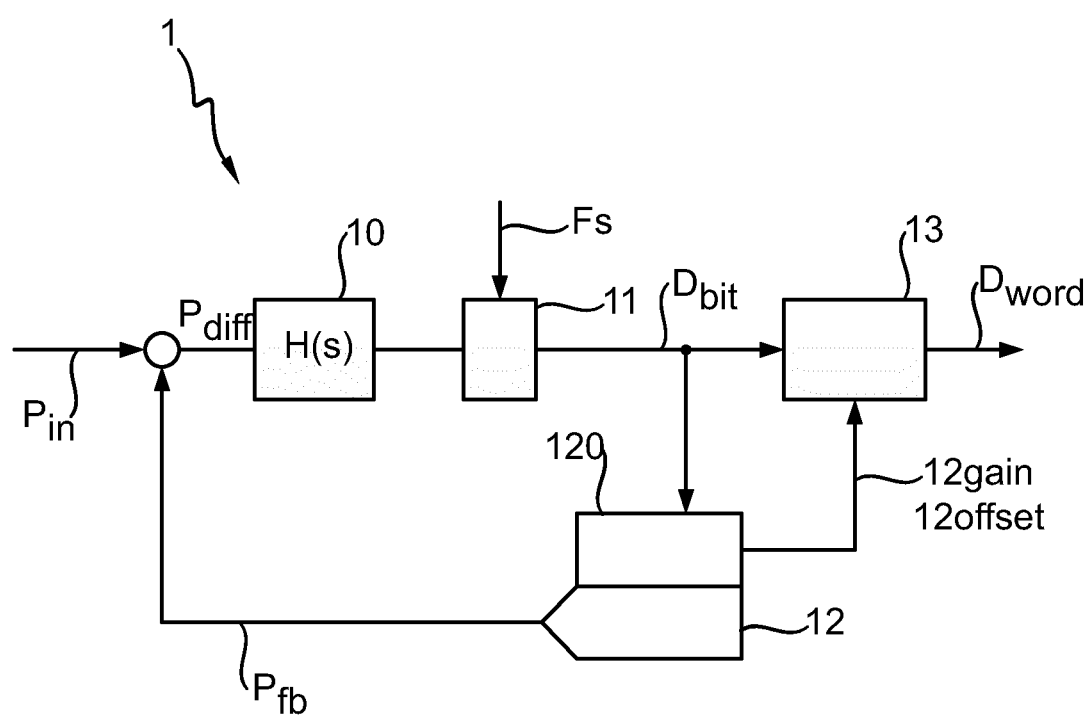
FIG. 1 shows a sigma-delta modulator according to a first embodiment of the invention.

FIG. 1 shows a sigma-delta modulator 1 according to an embodiment of the invention for use in an ADC. In this embodiment, the input $P_{in}$ to the SDM 1 is an analog signal, and the SDM output $D_{bit}$ is a bitstream, which can be fed to a suitable output stage 15 for computation of a digital output word $D_{word}$. The SDM 1 comprises an active loop filter 10 to achieve the desired input sensitivity and SNR, and a quantizer 11 to sample the input at a sampling frequency specified by a sampling clock $F_S$ and a comparator to convert the samples to the bitstream $D_{bit}$. To this end, a simple one-bit comparator can be used, and the SDM output will be a one-bit bitstream $D_{bit}$ that toggles between logic 1 and logic 0 (in reality logic 1 and logic 0 will correspond to specific voltage levels). During the analog-to-digital conversion of an input value, the SDM 1 observes the input signal over several clock cycles (the observation interval, and performs a number of iterations in which the bitstream $D_{bit}$ is fed back through a feedback path where it undergoes digital-to-analog conversion. The analog feedback signal $P_{fb}$ is subtracted from the analog input $P_{in}$. The difference $P_{diff}$ is once again sampled, thereby refining the estimate, and the new estimate is converted to the output bitstream $D_{bit}$. Essentially, the principle of operation of an SDM is to minimize the difference between input $P_{in}$ and feedback $P_{fb}$. If the SDM 1 is realized as an incremental SDM, the input should remain constant during a conversion step (e.g. sample-and-hold), and the SDM is reset after each iteration.

Figure 2:
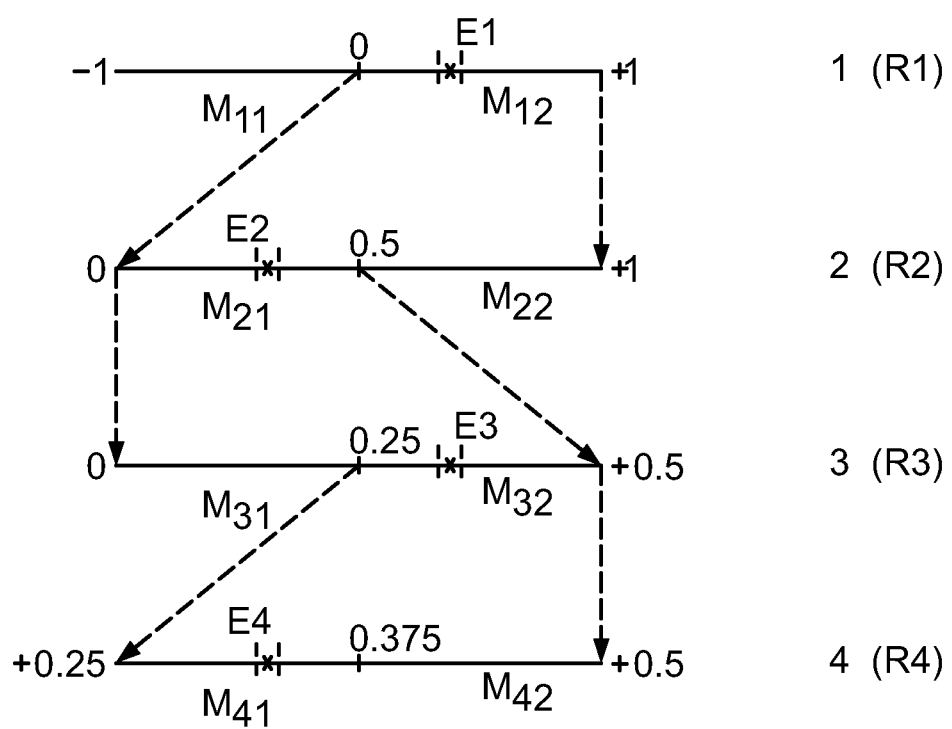
FIG. 2 illustrates dynamic range adjustment during the method according to the invention.

In the inventive SDM 1, the feedback path comprises an asymmetric programmable step DAC 12, and a configuration logic unit or range adjustment module 120 that programs the DAC 12 on the basis of the latest estimate to effectively adjust the dynamic range of the SDM 1. The effect of adjusting the dynamic range is shown in FIG. 2, which illustrates binary dynamic range scaling (M=2) in a four-step realization (N=4). For the sake of clarity, the initial input signal range R1 is normalized to ±1. On the right hand side of the diagram, the iteration count (from 1 to 4) is shown, along with an indication of the range (R1 to R4) applicable in each iteration. The initial range R1 is divided in two intervals or subranges, namely a first subrange $M_{11}$ extending from −1.0 to 0.0, and a second subrange $M_{12}$ extending from 0.0 to +1.0. In this example, it is estimated that the amplitude of the analog signal lies in the second subrange $M_{12}$. Once the initial estimate E1 of the input value has been made, the modulator 1 is effectively set to convert only signals that fall in that narrower second subrange R2. In the subsequent iteration, a better estimate E2 of the input value is made, and the range R2 is again divided in two subranges, in this case a first subrange $M_{21}$ extending from 0.0 to 0.5, and a second subrange $M_{22}$ extending from 0.5 to +1.0. Now, the modulator 1 is set to convert only signals that fall in range R2, since the improved estimate E2 lies in subrange $M_{22}$. In a subsequent iteration, the estimate of the input value is further improved as the modulator 1 "zooms" into the range of interest, with successive subranges of $M_{31}$ (0.0 to 0.25) and $M_{32}$ (0.25 to 0.5) of a third range R3, followed by subranges of $M_{41}$ (0.25 to 0.375) and $M_{42}$ (0.375 to 0.5) in a fourth range R4. The inventive modulator 1 makes use of the fact that any subsequent estimate will not deviate significantly from the preceding estimate. The more iterations (i.e. the higher the value of N), the greater will be the resolution of the ADC comprising the inventive SDM 1. Obtaining a coarse estimate can simply involve identifying the interval of the present range that contains the input signal. For example, when M=2, it would be enough to identify whether the input lies in the upper half or in the lower half of the present range. Improving the accuracy—i.e. increasing the resolution—of the last estimate(s) can be achieved by increasing the number of samples and/or the extending the sampling interval, for example.

Figure 3:
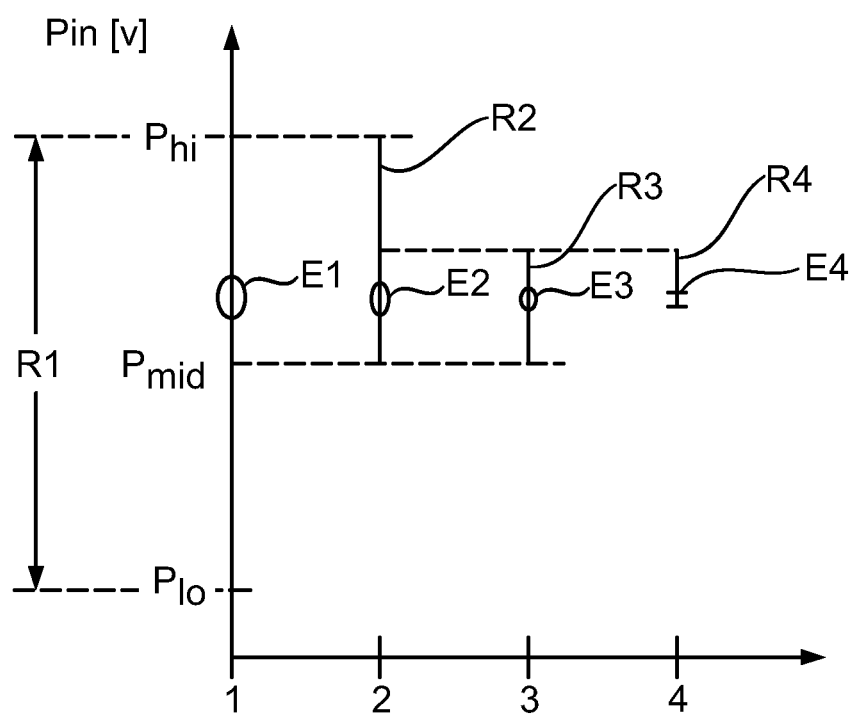
FIG. 3 illustrates dynamic range adjustment during the method according to the invention.

FIG. 3 illustrates the binary scaling scheme of FIG. 2 in an alternative manner. Here, an input signal $P_{in}$ to be converted by an ADC implementing the inventive modulator 1 can have a value anywhere between a minimum value $P_{lo}$ and a maximum value $P_{hi}$. The modulator 1 has a dynamic range initially defined by the ratio between the initial range R1 and the minimum detectable value. For each analog-to-digital conversion operation, an initial estimate E1 is obtained, and the modulator 1 then iteratively improves the estimation by identifying estimate E2 in a second range R2, estimate E3 in a third range R3, and a final very accurate estimate E4 in the fourth range R4. At each stage or iteration, the inventive modulator 1 converts only signals that fall in the respective subrange, so that the active loop filter 10 and quantizer 11 can deliver progressively finer estimations. A desired conversion resolution can be obtained by choosing a suitable number of iterations N. The number of iterations N performed by the inventive SDM can be hard-wired at the design stage. Alternatively, a suitable controller or logic could be implemented to allow on-the-fly adjustment of the iteration count N.

The diagram shows (in an exaggerated manner) the initial estimate E1 as a relatively inaccurate value, and the successive estimates E2-E4 as progressively finer values. For the initial estimate E1 and a number of further estimates (E2 and E3 in this case), a relatively coarse estimation is acceptable. Therefore, the sampling clock $F_s$ in the forward path of the SDM 1 can be chosen to result in a low OSR, for example an OSR of only 20. The final estimate E4 is obtained at a higher OSR to give a very accurate output value, for example at an OSR of 200.

An M-ary dynamic range scaling scheme has a scaling factor M. With an M-ary scaling scheme, the inventive SDM effectively "zooms into" a neighborhood which is 1/M of the current dynamic range. This was demonstrated in FIGS. 2 and 3 for a binary scaling scheme (M=2). The first few iterations do not require high accuracy, since a rough estimate E1, E2, E3 of the input signal value is enough to ensure correct estimation of the input value with respect to where it lies in the span of the present subrange. The first few iterations can therefore be performed with a fewer number of output bits and a lower oversampling ratio, as explained above, thereby requiring less power and less time. Complete utilization of the available resources in terms of power and conversion time is only required for the final iteration in order to deliver an output signal with the desired conversion accuracy. The effective resolution of the inventive SDM modulator 1 is given by equation (1) above.

The inventive "zoom SDM" achieves analog-to-digital conversion by successively narrowing the dynamic range in the vicinity of the applied input signal $P_{in}$. The adaptive dynamic range scaling is achieved by controlling the charge transferred by the feedback DAC. The feedback DAC does this by applying a certain gain and a certain offset to the feedback path. In each successive step of a conversion, the DAC adapts the gain and offset on the basis of the coarser estimate obtained in the previous step. The final digital word $D_{word}$ is then generated in the output stage 13 using the values of the gain $12_{gain}$ and offset $12_{offset}$ that were applied by the DAC 12 in the final step of the conversion. The formula for the final digital word $D_{word}$ can be expressed as: Final_Digital_Word=((Decoded_Value)−Offset_Final_Step)× Gain_Final_Step, where "Decoded_Value" is the digital word obtained in the final step by filtering the bit-stream $D_{bit}$ with a suitable window function such as a Hann window, and "Offset_Final_Step" and "Gain_Final_Step" are the values for offset $12_{offset}$ and gain $12_{gain}$ respectively that were applied by the DAC 12 in the final conversion step. The output stage 13 can be followed by further suitable processing stages such as a controller (not shown) to reduce the sampling rate and to increase the resolution of the output.

Figure 4:
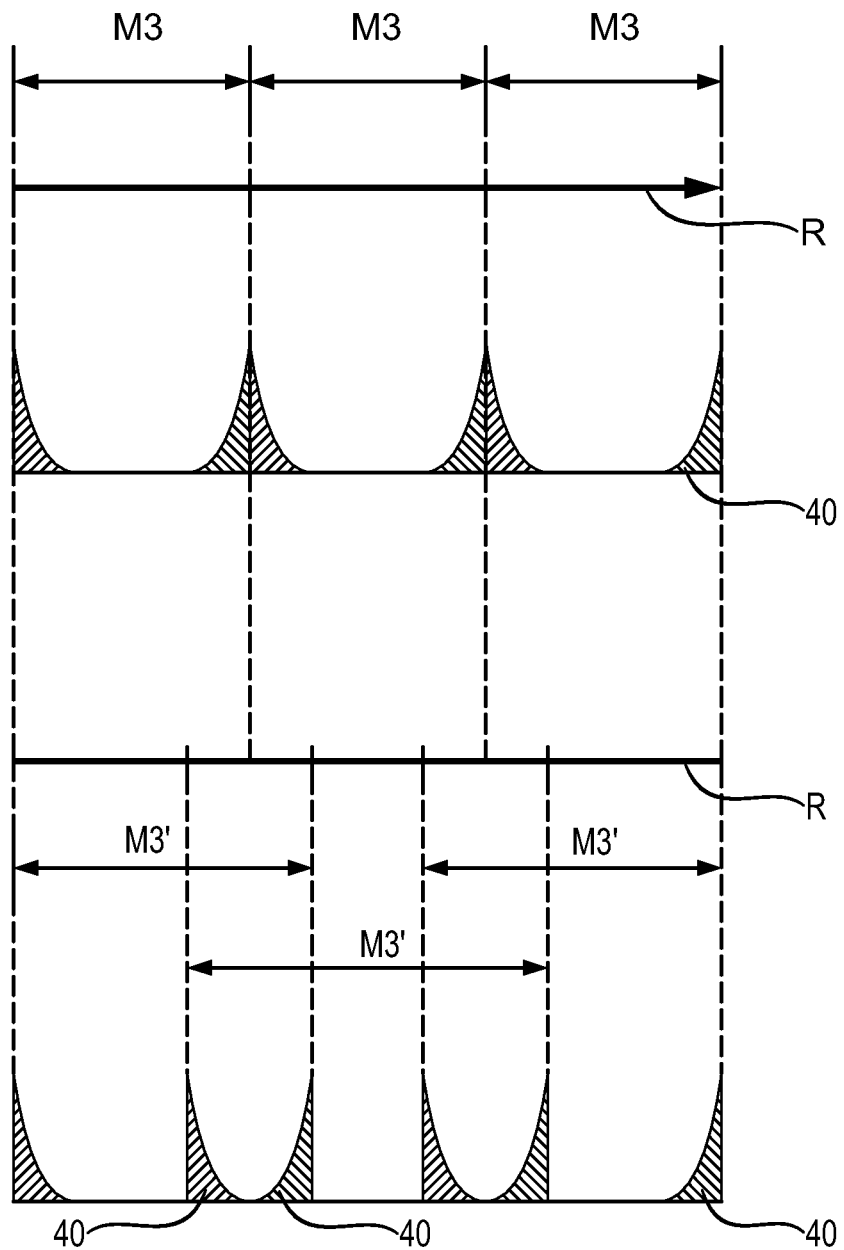
FIG. 4 shows two alternative M-ary divisions applied during the method according to the invention.

FIG. 4 illustrates different ways of performing M-ary dynamic range scaling. Here, the scaling factor M is 3. A range Rx during step x of an N-step modulation can be divided into three equal subranges M3. However, a higher-order modulator will overload (become less linear) as the input signal approaches the lower or upper limits of the modulator's dynamic range. The affected regions 40 are indicated in the diagram for each of the subranges M3, since any of these subranges can define the dynamic range of the following iteration. The accuracy of the estimation of an input signal lying inside such a region 40 may be quite inaccurate. This can be dealt with by allowing the subranges to overlap, as shown in the lower part of the diagram. Here, the outer portions of the subranges M3' overlap in places, thereby minimizing the error on signals that would otherwise lie close to the boundaries between adjacent subranges.

Figure 5:
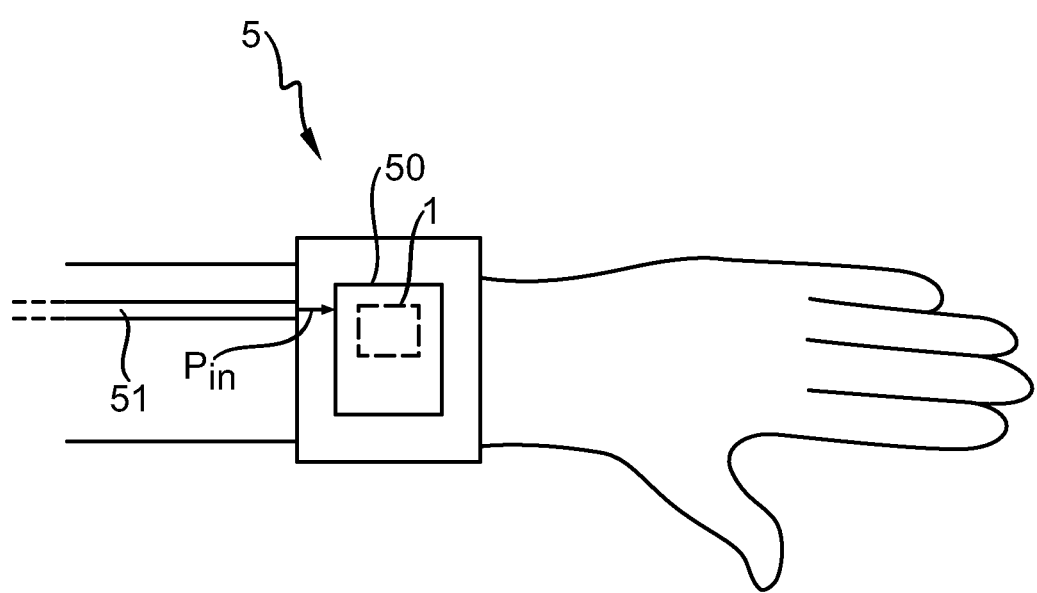
FIG. 5 shows a wearable vital signs monitoring device according to an embodiment of the invention.
Figure 6:
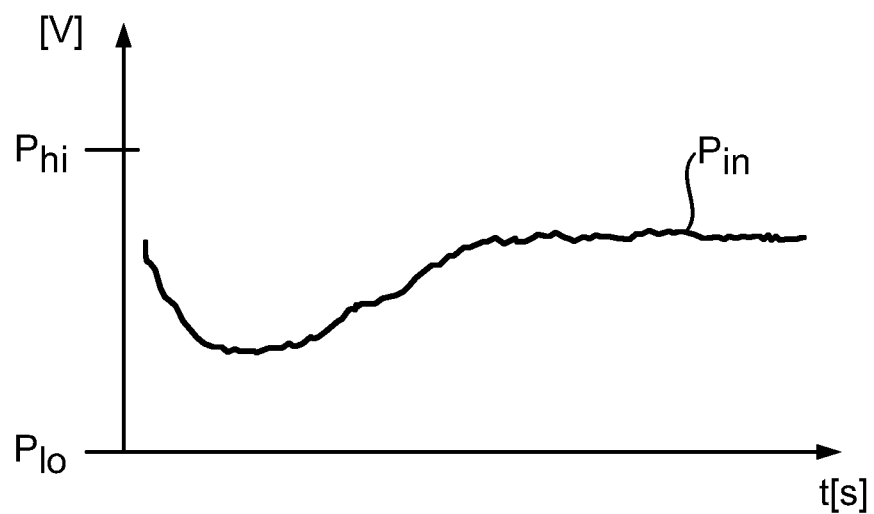
FIG. 6 shows an input signal from a vital signs monitoring device.

FIG. 5 shows a monitoring device 5 according to an embodiment of the invention. In this exemplary embodiment, the monitoring device 5 is a medical vital signs monitor 5 for monitoring EEG or ECG signals, and can be realized as a wearable device 5. One or more analog input signals $P_{in}$ can be monitored for observation purposes. An input signal $P_{in}$ (shown in FIG. 6) can originate from an ECG electrode attached to the patient's skin, an EEG scalp electrode, a subdural electrode, etc. connected to the device 5 by a lead 51. Such signals are generally low-amplitude signals, and can be near-DC. These types of signal are generally quite slowly varying. Analog-to-digital conversion of the input signal(s) is performed by an ADC 50 comprising an SDM 1 according to the invention. Other DSP functions can be implemented in the usual manner, for example a decimation filter at the output, etc. The digital output signal—i.e. a series of digital words provided by the SDM 1—can be processed as appropriate, for example to show a trace on a display, to be encoded for transmitting to a remote unit, etc. By means of a user interface (not shown), the patient, doctor, caregiver or other user can adjust the sensitivity or accuracy of the signal conversion and/or the input signal range of interest. The desired settings are converted as appropriate and used to configure the modulator 1, for example to adjust the accuracy of the analog-to-digital conversion.

Figure 7:
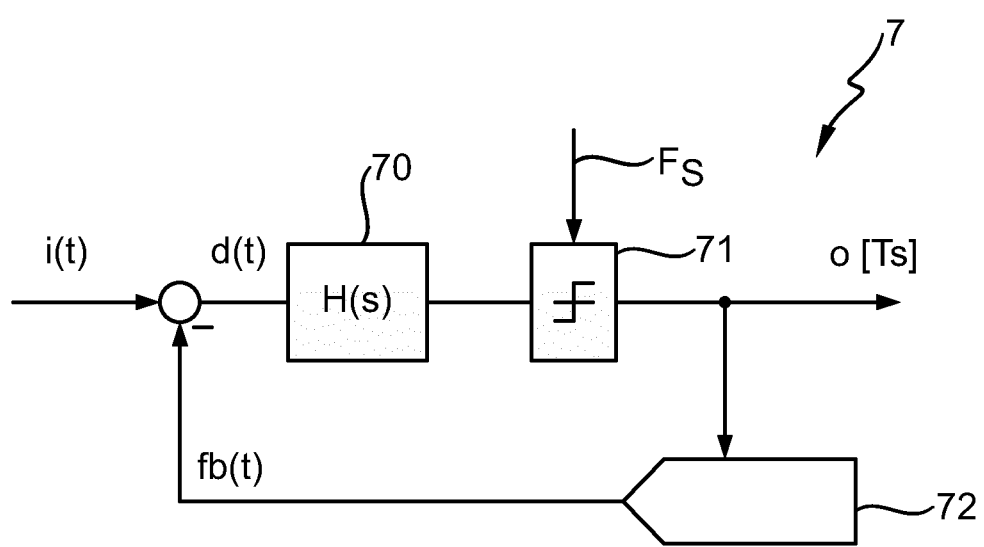
FIG. 7 shows a prior art sigma-delta modulator for use in an ADC.

FIG. 7 shows a prior art sigma-delta modulator 7 for use in an analog-to-digital conversion application. Similar to FIG. 1, the input i(t) to the SDM 7 is an analog signal, and the output $o[T_s]$ is a one-bit bitstream. During the conversion of an analog input to a digital output, the SDM 7 observes the input over the observation interval and performs a number of iterations in which the bitstream $o[T_s]$ is fed back through a feedback path that comprises a DAC 72. The feedback DAC 72 is fully symmetric, and converts 1 s and 0 s of the bitstream $o[T_s]$ to a feedback signal fb(t) which is subtracted from the analog input i(t). In the prior art realization, the dynamic range of the SDM 7 is fixed, so that the accuracy of the conversion is determined by the filter order, clock speed and quantizer resolution. In order to improve the performance of such an SDM 7, the observation interval can be extended. However, higher accuracy comes at the cost of a lower conversion rate, higher power consumption and greater chip area. An alternative approach is to use a higher order ISDM which shortens the required observation interval, but higher order filters have lower maximum stable amplitude (MSA) and also consume more power due to the greater number of operational amplifiers. Another approach is to use a two-step technique that involves converting the residue remaining after an initial conversion. A separate ADC can be required, thus adding to the overall cost and power consumption. Generally, the known alternatives are characterized by slower conversion and/or higher cost and/or higher power consumption.

Although the present invention has been disclosed in the form of preferred embodiments and variations thereon, it will be understood that numerous additional modifications and variations could be made thereto without departing from the scope of the invention. For example, the SDM can be realized to not require a hard reset of the loop filter at each step, thus further increasing the speed of conversion and avoiding reset artefacts. After each iteration of a conversion, the DAC can be reprogrammed without reset once the input value has been evaluated. The SDM of the invention can be realized according to a DAC programmability algorithm that applies a priori knowledge of the input signal statistics (of the intended application) at the manufacturing stage in order to determine an optimal dynamical range scaling algorithm for the asymmetrically controllable feedback DAC.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A method of performing analog-to-digital conversion on an input signal within a range using a sigma-delta modulator comprising a feedback digital-to-analog conversion arrangement, which method comprises an iterative method with at N iterations where N is at least three and in which at least iterations 2 through N−1 include the steps of:
   obtaining an amplitude estimate of the input signal in a range defined for the iteration;
   dividing the range defined for the iteration into M subranges where M is at least two;
   defining a range for the next iteration as the subrange of the M subranges that contains the amplitude estimate; and
   adjusting operation parameters of the feedback digital-to-analog conversion arrangement to set the range defined for the next iteration.

2. A method according to claim 1, wherein the amplitude estimate for iteration 1 is obtained at an oversampling ratio of at most 5.

3. A method according to claim 1, wherein the amplitude estimate for iteration N is obtained at an oversampling ratio of at least 50.

4. A method according to claim 1, wherein the feedback digital-to-analog conversion arrangement comprises an asymmetrically operated digital-to-analog converter, and the step of adjusting operation parameters of the feedback digital-to-analog conversion arrangement comprises adjusting gain and/or offset of the digital-to-analog converter.

5. A sigma-delta modulator of an analog-to-digital converter, comprising
   a forward path comprising an active loop filter and a quantizer for obtaining an amplitude estimate of an input signal within an input range;
   a feedback arrangement comprising a digital-to-analog converter and a range adjustment means, which range adjustment means is configured to:
   adjust the dynamic range of the sigma-delta modulator to a subrange of the input range wherein the subrange is defined by a midpoint and contains the amplitude estimate, wherein the midpoint of the adjusted dynamic range is independent of the midpoint defining the subrange; and
   adjust operation parameters of the feedback digital-to-analog conversion arrangement in accord with the adjusted dynamic range.

6. A sigma-delta modulator according to claim 5, wherein the digital-to-analog converter is realized as a switched capacitor bank.

7. A sigma-delta modulator according to claim 5, comprising an effective number of bits of at least 15.

8. A sigma-delta modulator according to claim 5, wherein the forward path comprises at least a second-order filter, and wherein the modulator is configured to obtain a non-final estimate at an oversampling ratio of at most 20, and to obtain a final estimate at an oversampling ratio of at least 150.

9. A sigma-delta modulator according to claim 5, realized as an incremental sigma-delta modulator.

10. An analog-to-digital converter for performing analog-to-digital conversion on an input signal, wherein the analog-to-digital converter comprises a sigma-delta modulator according to claim 5.

11. A device for performing analog-to-digital conversion on an analog input signal with an analog-to-digital converter that comprises a sigma-delta modulator according to claim 5.

12. A sigma-delta modulator according to claim 5, wherein the non-final amplitude estimate is obtained at an oversampling ratio of at most 5.

13. A sigma-delta modulator according to claim 5, wherein the amplitude estimate includes a non-final amplitude estimate and a final amplitude estimate, and the final amplitude estimate is obtained at an oversampling ratio of at most 200.

* * * * *